United States Patent
Bhide et al.

(10) Patent No.: US 12,078,680 B2
(45) Date of Patent: Sep. 3, 2024

(54) METHOD FOR DETECTING AN ELECTRICAL FAULT IN THE STATOR OF AN ELECTRIC MACHINE, ESPECIALLY IN THE GENERATOR OF A WIND TURBINE

(71) Applicant: Siemens Gamesa Renewable Energy A/S, Brande (DK)

(72) Inventors: Ravindra Bhide, Cambridge (GB); Nuno Miguel Amaral Freire, Brande (DK); Rahul R Pillai, Ikast (DK); Ireneusz Grzegorz Szczesny, Tørring (DK)

(73) Assignee: Siemens Gamesa Renewable Energy A/S, Brande (DK)

( * ) Notice: Subject to any disclaimer, the term of this patent is extended or adjusted under 35 U.S.C. 154(b) by 219 days.

(21) Appl. No.: 17/730,546

(22) Filed: Apr. 27, 2022

(65) Prior Publication Data
US 2022/0357397 A1 Nov. 10, 2022

(30) Foreign Application Priority Data
May 6, 2021 (EP) .................................... 21172507

(51) Int. Cl.
*G01R 31/34* (2020.01)
*F03D 7/02* (2006.01)
(Continued)

(52) U.S. Cl.
CPC ......... *G01R 31/346* (2013.01); *F03D 7/0224* (2013.01); *F03D 7/026* (2013.01);
(Continued)

(58) Field of Classification Search
CPC ...... G01R 31/346; G01R 31/52; G01R 31/72; F03D 7/0224; F03D 7/026; F03D 9/25;
(Continued)

(56) References Cited

U.S. PATENT DOCUMENTS 10,830,208 B2 * 11/2020 Tomas ..................... F03D 17/00
2011/0187304 A1 * 8/2011 Anwar ................. G01R 31/343
318/490
(Continued)

FOREIGN PATENT DOCUMENTS

CN 105866614 B 6/2018

OTHER PUBLICATIONS

H. Li, L. Qu, W. Qiao and C. Wei, "Current and rotor position sensor fault detection and isolation for permanent magnet synchronous generators in wind applications," 2017 IEEE Applied Power Electronics Conference and Exposition (APEC) (Year: 2017).*
(Continued)

*Primary Examiner* — Tung X Nguyen
*Assistant Examiner* — Robert P Alejnikov, Jr.
(74) *Attorney, Agent, or Firm* — Schmeiser, Olsen & Watts LLP

(57) ABSTRACT

A method for detecting an electrical fault in the stator of an electric machine is provided, wherein the stator includes multiple groups of windings, wherein the windings of each group are assigned to a respective phase of the electric machine, including the steps of: determining a respective current firstly between a subgroup of one of the groups of windings and a distinct further subgroup of the same group of windings and/or secondly between a subgroup of one of the groups of windings and a neutral point, and/or thirdly between a neutral point and either a further neutral point or to a common neutral point connected to at least the neutral point and the further neutral point, evaluating a fault condition, wherein the fulfilment of the fault condition depends on the respective determined current, and outputting a fault signal to personal and/or a device when the fault condition is fulfilled.

13 Claims, 7 Drawing Sheets

(51) Int. Cl.
  *F03D 9/25* (2016.01)
  *F03D 17/00* (2016.01)
  *H02P 9/02* (2006.01)

(52) U.S. Cl.
  CPC ............... *F03D 9/25* (2016.05); *F03D 17/00* (2016.05); *H02P 9/02* (2013.01); *F05B 2220/706* (2013.01); *F05B 2260/70* (2013.01); *F05B 2260/80* (2013.01); *F05B 2260/85* (2013.01)

(58) Field of Classification Search
  CPC . F03D 17/00; H02P 9/02; H02P 9/006; H02P 29/027; H02P 29/024; F05B 2220/706; F05B 2260/70; F05B 2260/80; F05B 2260/85; Y02E 10/72
  USPC ...................................................... 324/765.01
  See application file for complete search history.

(56) References Cited

U.S. PATENT DOCUMENTS

| 2014/0306583 A1* | 10/2014 | Moller ................... H02K 11/27 310/68 C |
| 2015/0276823 A1* | 10/2015 | Rodriguez ............. G01R 23/00 702/75 |
| 2019/0238077 A1* | 8/2019 | Azar ....................... H02P 21/22 |

OTHER PUBLICATIONS

F. Cheng, Y. Peng, L. Qu and W. Qiao, "Current-Based Fault Detection and Identification for Wind Turbine Drivetrain Gearboxes," in IEEE Transactions on Industry Applications (Year: 2017).*

European Search Report issued on Oct. 1, 2021 for application No. 21172507.2.

* cited by examiner

METHOD FOR DETECTING AN ELECTRICAL FAULT IN THE STATOR OF AN ELECTRIC MACHINE, ESPECIALLY IN THE GENERATOR OF A WIND TURBINE

CROSS-REFERENCE TO RELATED APPLICATIONS

This application claims priority to EP Application No. 21172507.2, having a filing date of May 6, 2021, the entire contents of which are hereby incorporated by reference.

FIELD OF TECHNOLOGY

The following concerns a method for detecting an electrical fault in the stator of an electric machine, especially in the generator of a wind turbine, wherein the stator comprises multiple groups of windings, wherein the windings of each group are assigned to a respective phase of the electric machine. The following also concerns an electric machine arrangement and a wind turbine.

BACKGROUND

Electrical faults in a stator, especially shorts between adjacent turns of a winding that are also called turn faults, are common failure modes in electric machines. When the electric machine is used as a generator, such electrical faults can lead to a strong local heating and therefore the risk of damaging the generator and surrounding components. Similar problems occur when the electric machine is uses as a motor. It is therefore highly relevant to detect such an electrical fault as soon as possible, to allow for a shutdown, for a modification of the operation of the electric machine and/or for informing service personal before such an electrical fault can lead to further damages.

Approaches for detecting turn faults are well known in the conventional art. Typically, an electrical imbalance of the machine due to the turn fault is detected, e.g., by using a negative sequence voltage. Such an approach is disclosed in the document US 2011/0187304 A1. Such a measurement is performed while the generator drives a load, therefore potentially leading to very high currents and therefore to strong local heating when a turned fault is present. This can cause a fire hazard or damage to further components.

Turn faults can potentially also be detected by measuring vibrations of the generator due to a torque ripple caused by the electrical fault. However, in a large machine the torque ripple caused by a turn fault in a single one of multiple parallel paths and therefore the resulting vibration is relatively small and therefore the sensitivity of such an approach is relatively low. Even when a fault is detected, it is typically not possible to identify which of the many windings of a large machine comprises the electrical fault.

SUMMARY

An aspect relates to an improved fault detection with a lower risk of damaging further components and/or an increased sensitivity, that allows for a certain degree of fault localization.

The problem is solved by the initially described method comprising the following steps:
  determining a respective current
    firstly between a subgroup of one of the groups of windings comprising at least one winding of that group and a distinct further subgroup of the same group of windings comprising at least one further winding of the same group and/or
    secondly between a subgroup of one of the groups of windings comprising at least one winding of that group and a neutral point that is connected to at least one winding of each of the groups, and/or
    thirdly between a neutral point that is connected to at least one winding of each of the groups and either a further neutral point that is connected to at least one further winding of each of the groups or to a common neutral point connected to at least the neutral point and the further neutral point,
  evaluating a fault condition, wherein the fulfilment of the fault condition depends on the respective determined current, and
  outputting a fault signal to personal and/or a device when the fault condition is fulfilled.

The windings of each group are assigned to a respective phase of the electrical machine. The windings of each respective group can be connected to a respective phase connection of the electric machine. The respective phase connection can be connected to a junction box and/or a generator circuit breaker. A subgroup can comprise a single winding or all windings of a certain group in a given segment of the stator.

The electric machine can be a generator or a motor. When a motor is used as the electric machine, it can especially be rotated and/or its rotational speed can be increased by outside torque provided by a manual rotation or a further motor, while the current or currents are measured.

The method exploits the fact that electrical faults in a stator change the impedance of a winding that comprises such a fault. This is especially true for turn-to-turn faults that create a short between adjacent turns of a winding. Since the individual windings are connected to an optionally grounded, neutral point of the polyphase system, a change of the impedance of one of the windings shifts the potential on the side of that winding that is connected to the phase connection for the respective group. This leads to a potential difference between points of the circuit that would otherwise be on the same potential and therefore lead to circular currents within the stator windings.

This fact is exploited by measuring the circular current running through a winding or by measuring at least one current that is at least partially caused by such a current. This type of a measurement has the advantage that it can be measured while the electric machine is not providing any current and especially while the electric machine is not connected to a load. It is possible to perform the fault detection according to the previously discussed method during the spin up of a wind turbine before a cut in speed is reached and the electric machine is connected to an external load.

Since the measured current will typically be sufficiently high to reliably detect such a fault before there is a notable increase in temperature due to the circular current caused by the fault, the initially discussed risk of damaging further components or even causing a fire hazard can be avoided. By performing such measurements for different groups and/or subgroups within the same group it is also possible to localize the winding or subgroup of windings comprising the electrical fault.

Circular currents between parallel windings and therefore also the current measured in the previously discussed method can especially be high when all windings of the stator are connected to a single neutral point, also called a star point. It was however realized that sufficiently large circular currents to perform the discussed method are also present, when the stator has several separate neutral points that are each connected to at least one winding of each of the phases. If there is an electrical fault in a winding of a specific phase, a current transport between the different neutral points is required to allow for the circular current to flow in this case. This current between the different neutral points can be directly measured or a current between a respective neutral point and the common neutral point connecting separate neutral points for different segments of the stator can be measured to detect the electrical fault.

When distinct neutral points are used that are not connected via a common neutral point, these neutral points are however still connected via the windings of the further phases, therefore still allowing for a circular current to flow within the phase comprising the electrical fault. While this leads to an additional impedance for the circular current and therefore to a lower circular current than in the case where a single neutral point is used, the resulting circular currents are still sufficient to allow a fault detection by the previously discussed method.

The current can be measured while a rotor of the electric machine is rotating. It is desirable, to perform the current measurement while there is essentially no electrical load present on the electric machine, e.g., while a circuit breaker between the electric machine and a load is open and/or while a current converter comprising semiconductor switches disconnects the windings from a load.

The windings of each respective group can be connected to a respective phase connection of the electric machine. The phase connection is typically connected to a junction box and/or a generator circuit breaker. The different windings of a respective phase or group can be essentially connected in parallel between the phase connection and a common neutral point or a respective neutral point. When distinct neutral points are used, there might be a slight potential difference between these neutral points and therefore a slight deviation from a strictly parallel connection of the windings of the respective group or phase.

The further subgroups of the windings of the respective group can comprise all of the windings of that group that are not part of the first subgroup. Therefore, the measured current can be a current between the respective subgroup and all other windings of the same group.

The respective current can be determined using a current sensor connected between the subgroup of the windings and either the phase connection for that group of windings or the neutral point. The subgroup and the further subgroup can both be connected to the phase connection of the respective phase and can therefore be connected via the current sensor connected between the subgroup and the phase connection.

In an embodiment the current is measured while the phase connections of the electric machine are disconnected from a load, e.g., by a circuit breaker and/or by semiconductor switches. The semiconductor switches can be switches used in a power converter. It is possible that the converter is operated using pulse width modulation. By reducing the pulse width for all switches to zero a load can be disconnected. In this case no current or only a negligible leakage current can pass through the respective phase connection and therefore the current through the current sensor can be completely caused by a circular current that is very low when there is no electrical fault and strongly increases when an electrical fault is present. The electrical fault can then e.g., be simply detected by comparing the measured current to a threshold. It might however be advantageous to perform some prior processing, e.g., to combine and/or compare different measured currents.

Respective currents can be determined for at least two of the groups and/or for at least two distinct subgroups of at least one of the groups, wherein the respective subgroup comprises at least one winding and the current for a respective subgroup is the current between the respective subgroup and either a respective further subgroup of the same group of windings comprising at least one further winding of the same group or the neutral point or a respective neutral point, wherein the fulfilment of the fault condition depends on the determined currents. The respective further subgroup can especially comprise all windings of the respective group that are not part of the respective subgroup. In other words, for each of multiple subgroups a current from the windings of the respective subgroup to the further windings of the same group that are not part of this subgroup can be determined.

The fault condition can comprise multiple subconditions, each subcondition depending on one of the determined currents. The fault condition can be fulfilled if at least one of the subconditions is fulfilled. The fulfilment of a respective subcondition can indicate the presence of a fault in the respective group and/or subgroup, for which the current measurement was performed.

The respective current can be determined while there is no power provided by the electric machine and/or while the phase connections of the stator are disconnected from a load and/or while the current driven through the phase connections is zero or lower than a threshold. It is a quite common approach for spinning up a wind turbine, that an electric machine used as generator is only connected to a load once a certain cut-in speed of the wind turbine and therefore of the rotor of the electric machine is reached. It is therefore especially possible to perform the current measurement or measurements and therefore the detection of an electrical fault during the spin up of the wind turbine before the cut-in speed is reached and therefore before the generator is connected to a load.

The fact that the current driven through the phase connection is lower than a threshold can be explicitly checked by measuring the respective current driven through the respective phase connection. It is however also possible to assume, that the current is below this threshold, when this is clearly indicated by further parameters of the wind turbine, when an electronic switch connecting the respective phase connection to a load is open, allowing only negligible leakage currents to pass the switch, by disabling a converter by setting the pulse width of a switch control signal to zero.

Multiple measurements of the respective current can be taken over given time interval and the fulfilment of the fault condition can depend on the multiple measurements. It is possible to determine a maximum for a current during the time interval. Alternatively, or additionally, a temporal development of the respective current can be considered, e.g., a correlation with the rotational speed of the rotor of the electric machine.

The rotational speed of the rotor of the electric machine can be increased during the given time interval. As previously discussed, the measurements can especially be performed during the spin up of a wind turbine.

The electric machine can be a generator of a wind turbine, wherein the wind turbine is started by pitching blades of the wind turbine to increase the speed of the rotor of the electric machine from a standstill, wherein the given time interval covers at least part of the time interval between a starting time at which the rotor is at a standstill and an ending time at which the electric machine is connected to a load. In other embodiments the electric machine could e.g., a large generator having multiple sets of parallel windings or even a motor. The increase in rotational speed could then be driven by an external motor driving this electric machine.

The ending time can especially correspond to a time when the rotational speed of the rotor of the electric machine reaches a given threshold, especially the previously mentioned cut-in speed. The time interval can especially end prior to the cut in of the generator. This allows for a suppression of the connection of the load, if the fault condition is fulfilled.

Alternatively, it would be possible to still connect a load to the generator, even when the fault condition is fulfilled. It might be possible, to only communicate a warning to personal or a device when the fault condition is fulfilled and otherwise perform a normal operation of the generator or to only modify certain parameters of the operation, e.g., a maximum of the rotational speed of the generator, a maximum load, etc.

A respective maximum value for the respective current can be determined from the multiple measurements for the respective current, wherein the fulfilment of the fault condition can depend on the respective maximum value. This can be achieved by digitally recording a sequence of current measurements and selecting the largest value from these measurement values or by using a circuit that holds the maximum of the output of an envelope follower following the current.

Several segments of the stator can each comprise at least one winding of each group, wherein the windings of the respective segment are connected to a neutral point of that segment,
  wherein either the windings of at least one of the segments provide the only electrical connection between the neutral point of that segment and the windings of the other segments,
  or wherein the neutral points are connected to a common neutral point, especially via a respective current sensor.

The first alternative is an example for the initially discussed alternative, in which several separate neutral points are used. Alternatively, it would be possible that all the windings are connected to a common neutral point.

The use of separate neutral points typically simplifies the wiring of the stator. Since the use of separate neutral points requires the circular current due to an electrical fault in a single phase to be conducted through windings of other phases, as previously discussed, the use of distinct neutral points for the different segments can also simplify the monitoring of the different phases. When currents between subgroups of windings in the same group are measured, the use of a single neutral point would require current sensors for each of the phases of the electric machine, when an electrical fault in each phase should be detectable. The use of separate neutral points does however lead to an increase of the measured currents in the remaining phases, if there is an electrical fault in a first phase. Therefore, an essentially identical increase of the measured currents for two phases already indicates that there is an electrical fault in a third phase. Therefore, the use of separate neutral points can allow one of the phases to remain unmonitored. When a common neutral point is used, it is however also possible to measure currents between neutral points for the individual segments and the common neutral point and therefore potentially use an even lower number of sensors, especially only a single sensor for each segment and/or neutral point.

A respective measure for vibrations of the electric machine and/or for an amplitude of torque oscillations of the torque acting on the rotor of the electric machine can be determined, wherein the fulfilment of the fault condition can depend on the respective measure.

It is possible to record a torque and/or acceleration for a given time interval, especially the time interval discussed above, and to detect a maximum of the amplitude of oscillations of the torque and/or the acceleration. It is especially possible to only consider oscillations at a specific frequency, e.g., at a certain harmonic of the electrical frequency output by the electric machine. It was realized that an electrical fault and the resulting torque oscillations will typically result in a strong increase of vibrations and torque oscillations at twice the electrical frequency. This frequency band can be isolated by a bandpass filter or the measurement data can be digitally sampled and be transferred to the frequency domain by a Fourier transform to a determine a vibrational amplitude in the relevant frequency range.

Embodiments of the invention also concern an electric machine arrangement, especially for a wind turbine, comprising an electric machine with a stator having multiple groups of windings, wherein the windings of each group are assigned to a respective phase of the electric machine, and a monitoring device, wherein the monitoring device and the electric machine are configured to perform the method according to embodiments of the present invention.

The monitoring device can comprise at least a one current sensor for determining the respective current and a processing unit for evaluating the fault condition and optionally for performing further steps of the method discussed above.

The monitoring device can be integrated within the electric machine and can be attached to the stator or a housing of the stator. Alternatively, at least some of the components of the monitoring device can be spaced apart from the electric machine. It is possible that current sensors are integrated within the electric machine and that the processing unit and/or a signalling unit used to output the fault signal to personal and/or a device are spaced apart from the electric machine. These components can be mounted to another part of the wind turbine, within the tower or a base or can even be mounted outside the wind turbine when the electric machine is part of a wind turbine. It is even. possible that the processing unit is implemented as a network based or a cloud based solution. It could be possible that the current sensor or sensors communicate via a network protocol, e.g., via TCP/IP, to an offsite unit or more typical to a local control unit that is assigned to an individual wind turbine or to a small cluster of wind turbines.

Additionally, embodiments of the invention concern a wind turbine that comprises an electric machine arrangement. As previously discussed, the discussed method and therefore the discussed electric machine arrangement are especially when a large-scale electric machine is used as in wind turbines.

BRIEF DESCRIPTION

Some of the embodiments will be described in detail, with reference to the following figures, wherein like designations denote like members, wherein.

DETAILED DESCRIPTION

Figure 1:
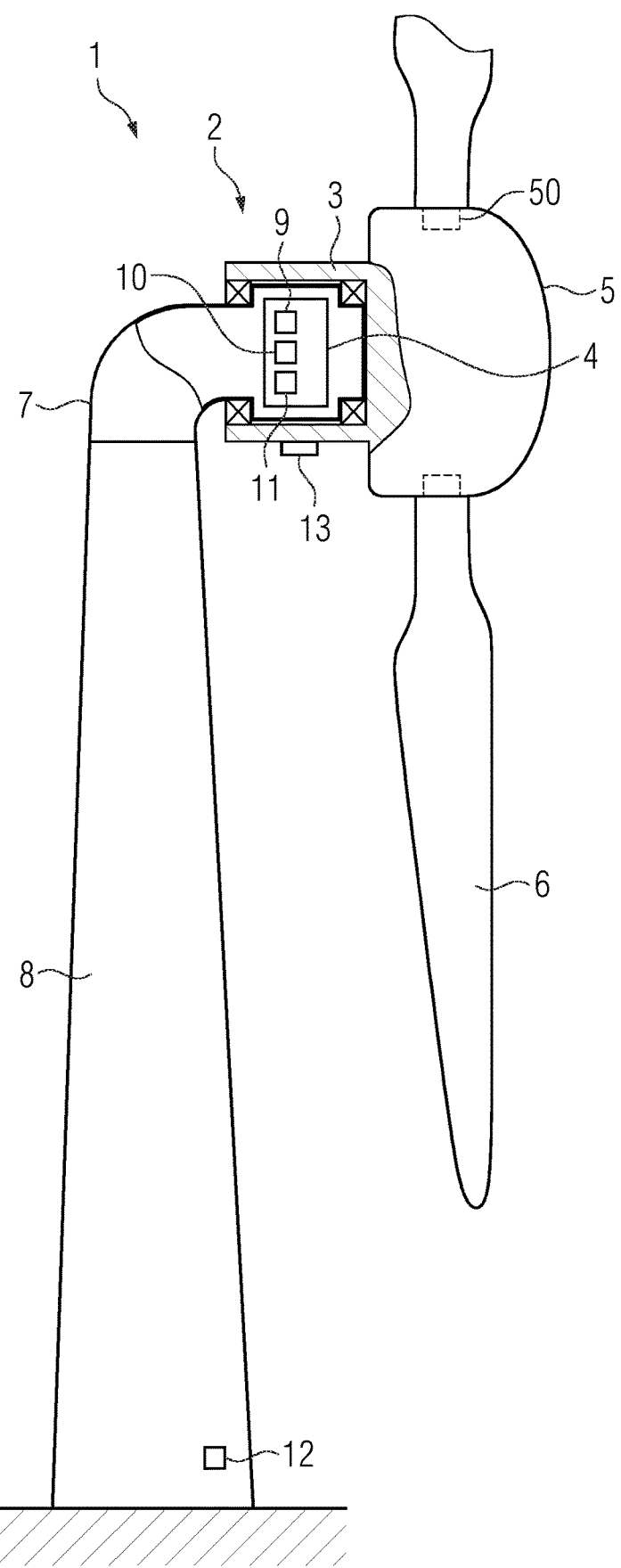
FIG. 1 shows an exemplary embodiment of a wind turbine comprising an exemplary embodiment of an electric machine arrangement.

FIG. 1 shows a wind turbine 1 comprising an electric machine arrangement that in turn comprises the electric machine 2, in the example a generator, and a monitoring device used to detect electrical faults in a stator 4 of the electric machine 2. The rotor 3 of the electric machine 2 is connected to the hub 5 of the wind turbine that carries the blades 6. The stator 4 is attached to a nacelle 7 that is carried by a tower 8.

In the example the rotor 3 is arranged outside of the stator 4 in the electric machine 2, it would however also be possible to use a stator surrounding the rotor.

Figure 2:
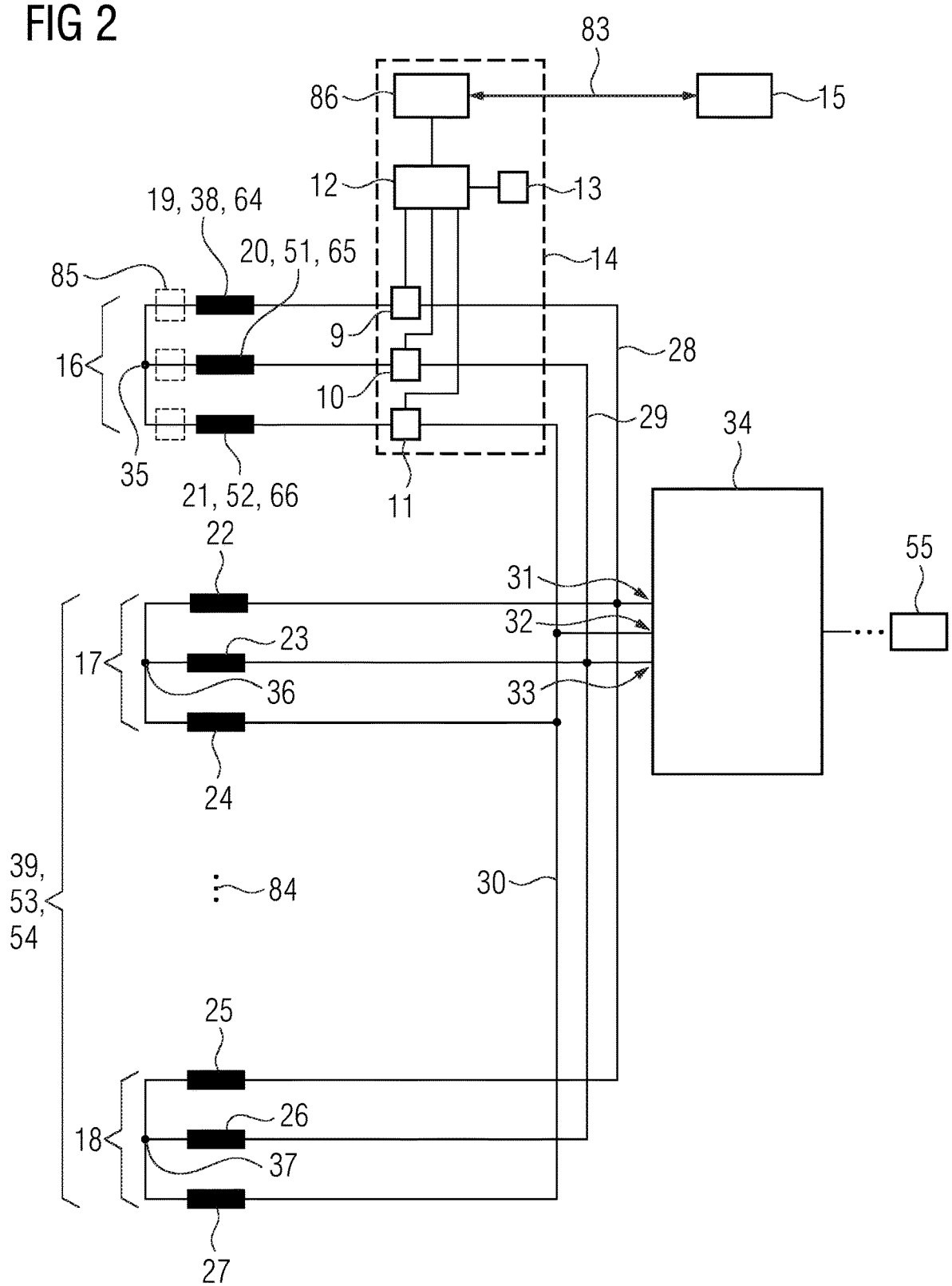
FIG. 2 shows a schematic diagram of the electric machine arrangement shown in FIG. 1.

For reasons of simplicity and clarity only a few of the components of the monitoring device are shown in FIG. 1, namely the current sensors 9-11 and a processing unit 12. A more detailed schematic diagram of the monitoring device 14 and its interaction with the electric machine 2, namely with the different windings 19-27 of the stator 4 of the electric machine 2, is shown in FIG. 2. For simplicity's sake FIG. 2 only shows the use of the monitoring device 14 to monitor a single segment 16 of the stator 4. Obviously, additional current sensors could be used to monitor currents through the further windings 22-27 and therefore to also detect electrical faults in the further segments 17, 18. To be able to localize faults in all segments, the use of n–1 sensors per phase is sufficient, wherein n is the number of stator segments.

As shown in FIG. 2, the electric machine 2 comprises three groups 38, 51, 52 of windings 19-27, wherein the windings 19-27 of each group 38, 51, 52 are assigned to a respective phase 28-30 of the electric machine 2. In the example the windings 19, 22 and 25 are part of the group 38, the windings 20, 23 and 26 are part of the group 51 and the windings 21, 24 and 27 are part of the group 52. One side of the windings 19-27 of the respective group 38, 51, 52 is connected to a respective phase connection 31-33 of the respective group 38, 51, 52. The phase connections 31, 32, 33 can be connected to a circuit breaker 34 of the electric machine 2 or further electronics of the electric machine 2.

In the example shown in FIG. 2, the stator 4 comprises several segments 16, 17, 18, each of the segments 16, 17, 18 comprising a single winding 19-27 from each of the groups 38, 51, 52, wherein the three windings 19-27 of the respective segment 16, 17, 18 are connected to a respective neutral point 35, 36, 37 of the three phase system. As indicated by the dots 84, typically stators 4 with more than three segments 16, 17, 18, e.g., stators using twelve segments, are used.

The use of a separate neutral point 35, 36, 37 for each of the segments 16, 17, 18 can reduce the complexity of the wiring of the stator 4. In an alternative embodiment it would be possible, to use a common neutral point or to directly connect all the neutral points 35, 36, 17 in FIG. 2. In this case an electrical fault in the windings 19-27 would lead to higher circular currents and therefore higher currents measured by the current sensors 9, 10, 11 then in the shown embodiment. It was however found that a robust detection of electrical faults is also possible, when separate neutral points 35, 36, 37 are used for the different segments 16, 17, 18.

For the following discussion it is assumed that there is an electrical fault in the winding 19, especially a turn-to-turn fault. This electrical fault can be detected even when there is no load 55 driven by the electric machine 2, e.g., when a circuit breaker 34 is open.

The electrical fault of the winding 19 will result in the winding 19 having a different impedance than the further windings 22, 25 of the group 38. If the neutral points 35, 36, 37 of the different segments 16, 17, 18 would be directly connected, this would lead a circular current within the phase 28 when the rotor 3 is rotating.

A similar effect results even when the different segments 16, 17, 18 use separate neutral points 35, 36, 37, since a current transport between the neutral points 35, 36, 37 is possible by the further phases 29, 30 in this case. An electrical fault in the winding 19 will therefore lead to a strong increase in the current measured by the current sensor 9 and a lower, typically approximately half as strong, increase the currents measured by the current sensors 10, 11.

Figure 3:
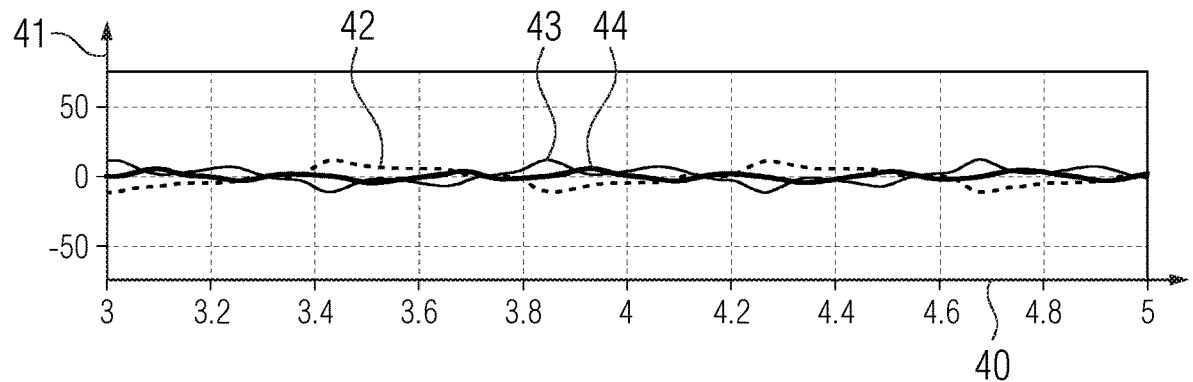
FIG. 3 shows current measurements for the three current sensors shown in FIG. 2 at different rotational speeds of the electric machine.
Figure 4:
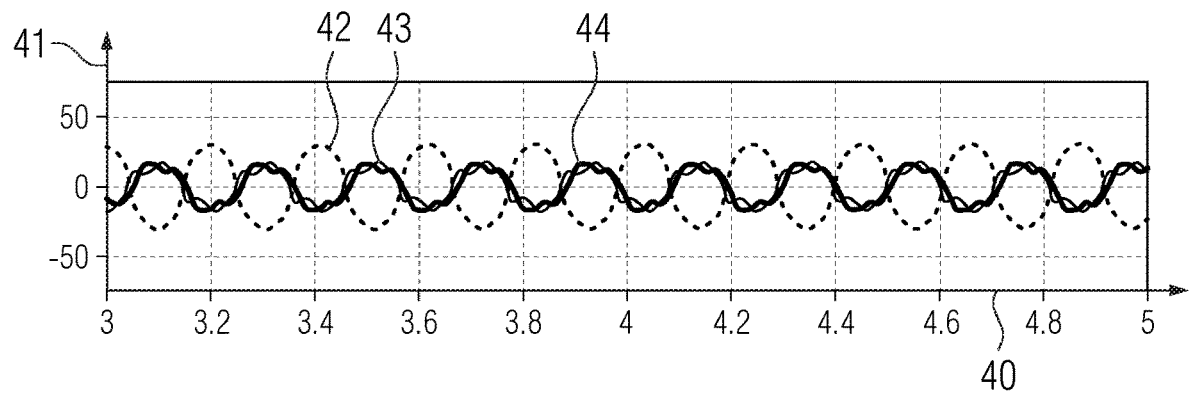
FIG. 4 shows current measurements for the three current sensors shown in FIG. 2 at different rotational speeds of the electric machine.
Figure 5:
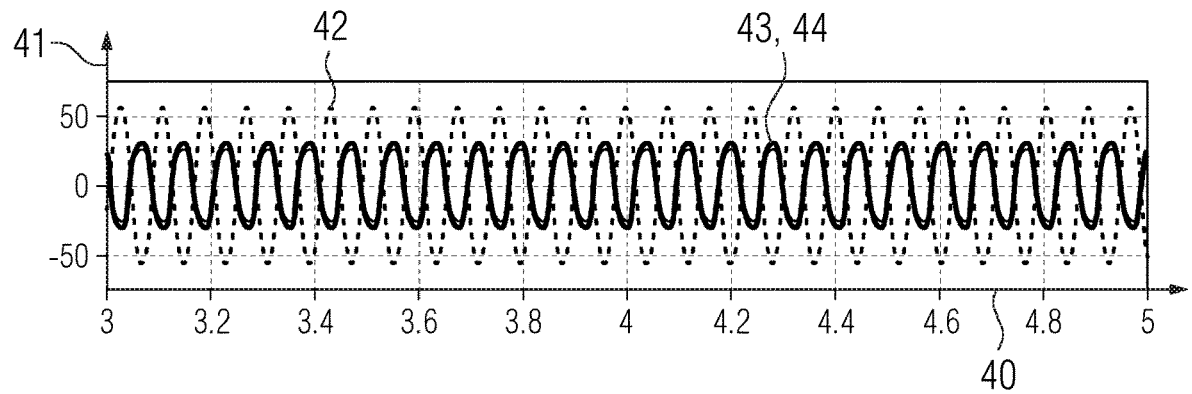
FIG. 5 shows current measurements for the three current sensors shown in FIG. 2 at different rotational speeds of the electric machine.

The currents 42-44 measured by the current sensors 9-11 are illustrated in FIGS. 3 to 5 for different rotational speeds of the rotor 3. The respective x-axis 40 corresponds to the time and the respective y-axis 41 responds to the measured current. The data shown in FIG. 3 was acquired at a very low rotational speed of 1 rpm, the data shown in FIG. 4 was acquired at a higher rotational speed of 4 rpm and the data shown in FIG. 5 was acquired at a rotational speed slightly below the cut-in speed of the wind turbine, at which the electric machine 2 would be connected to a load 55, in the example at a speed of 10.3 rpm.

At very low rotational speeds the effect of the electrical fault in the winding 19 is not clearly detectable. Increasing the rotational speed to 4 rpm does allow for a clear detection of the electrical fault as can be seen in FIG. 4. While the slightly larger amplitude of the current 42 measured by the current sensor 9 in comparison to the currents 43 and 44 measured by the current sensors 10, 11 might be hard to detect due to the noise level, the fact that the currents in the phases 29, 30 detected by the current sensors 10, 11 both have the same phase and are both phase shifted with respect to the current in the phase 28 detected by the current sensor 9 by 180° clearly indicates that the observed currents are caused by a difference in the impedance between the windings 19, 22, 25 in the phase 28 and that the increased currents 43, 44 measured by the current sensors 10, 11 result from closing the current loop for the circular current of the phase 28 via the phases 29, 30, since the neutral points 35, 36, 37 are not directly connected.

When the currents 42 to 44 are measured at even higher rotational speeds as shown in FIG. 5, it becomes immediately notable that rather high currents 42 are measured by the current sensor 9 due to the electrical fault in the winding 19 and that these currents 42 are noticeably higher than the currents 43, 44 measured in the other phases 29, 30 by the current sensors 10, 11. Therefore it is easily detectable, e.g. by a comparison of the maximum measured current to a threshold value, that there is an electrical fault in the stator 4, namely in the winding 19.

Figure 6:
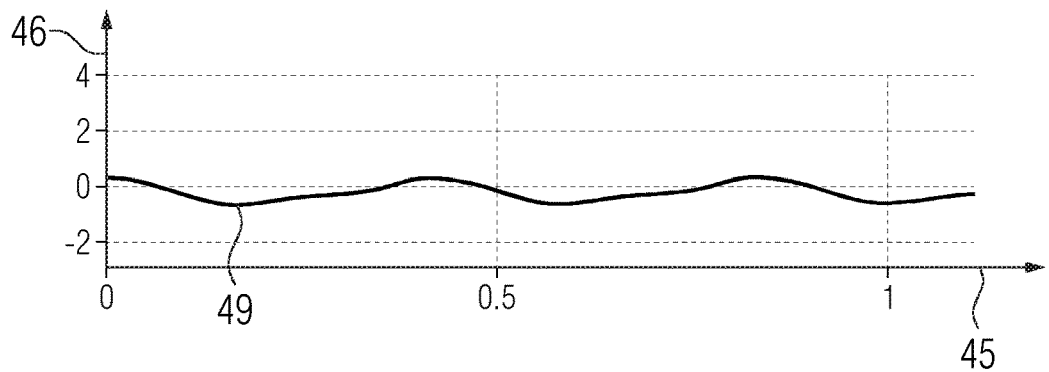
FIG. 6 shows measurements for torque oscillations acting on the rotor in the electric machine arrangement shown in FIG. 2 at different rotational speeds of the electric machine.
Figure 7:
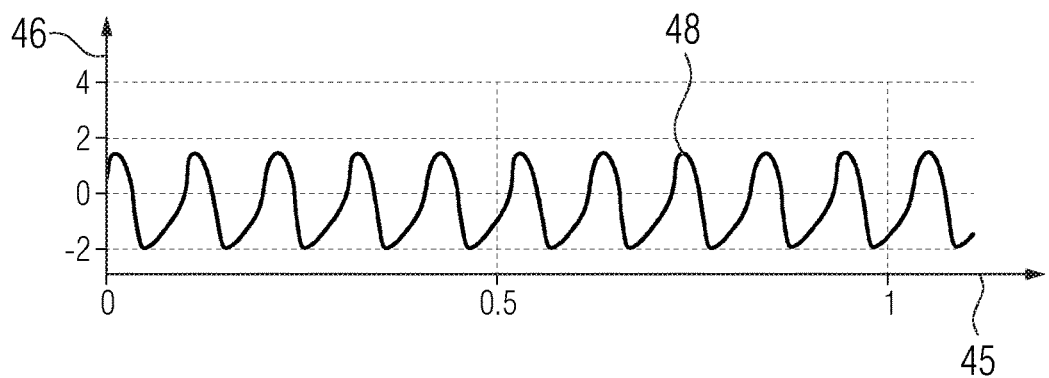
FIG. 7 shows measurements for torque oscillations acting on the rotor in the electric machine arrangement shown in FIG. 2 at different rotational speeds of the electric machine.
Figure 8:
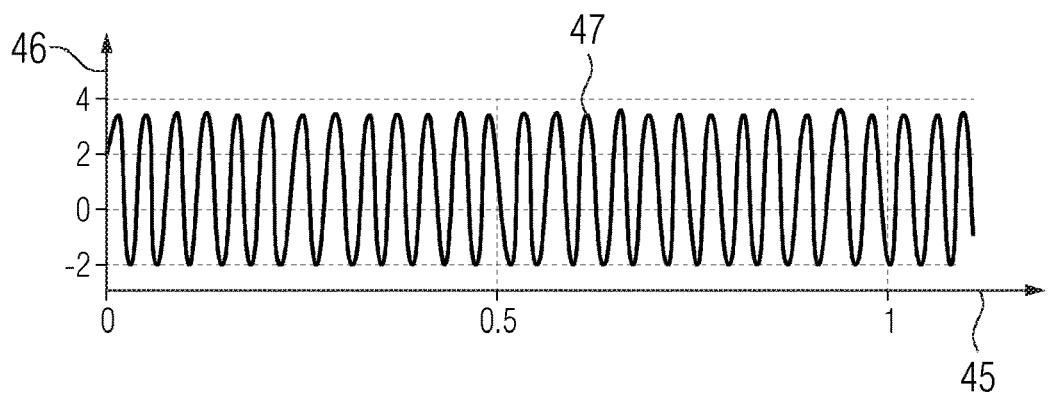
FIG. 8 shows measurements for torque oscillations acting on the rotor in the electric machine arrangement shown in FIG. 2 at different rotational speeds of the electric machine.

A further effect of an electrical fault in the winding 19 is a ripple of the torque acting on the rotor 3. This effect is shown in FIGS. 6 to 8, wherein the respective x-axis 45 shows the time and the respective y-axis shows the calculated torque, in the example in the unit of $10^4$ Nm. The measurements 49 in FIG. 6 were recorded at 1 rpm, the measurements 48 in FIG. 7 were recorded at 4 rpm and the measurements 47 in FIG. 8 were recorded at 10.3 rpm.

It is immediately obvious from these figures that especially at higher rotational speeds immediately prior to the cut-in speed of the electric machine 2 oscillations of the torque are clearly notable. These oscillations could be directly measured. In many cases it is however simpler to use an accelerometer 13, since oscillations in the applied torque immediately result in vibrations. It was recognized that vibrations and therefore oscillations in the acceleration are especially caused at a frequency that is twice the frequency of the provided current when there is an electrical fault in one of the windings 19-27.

Figure 9:
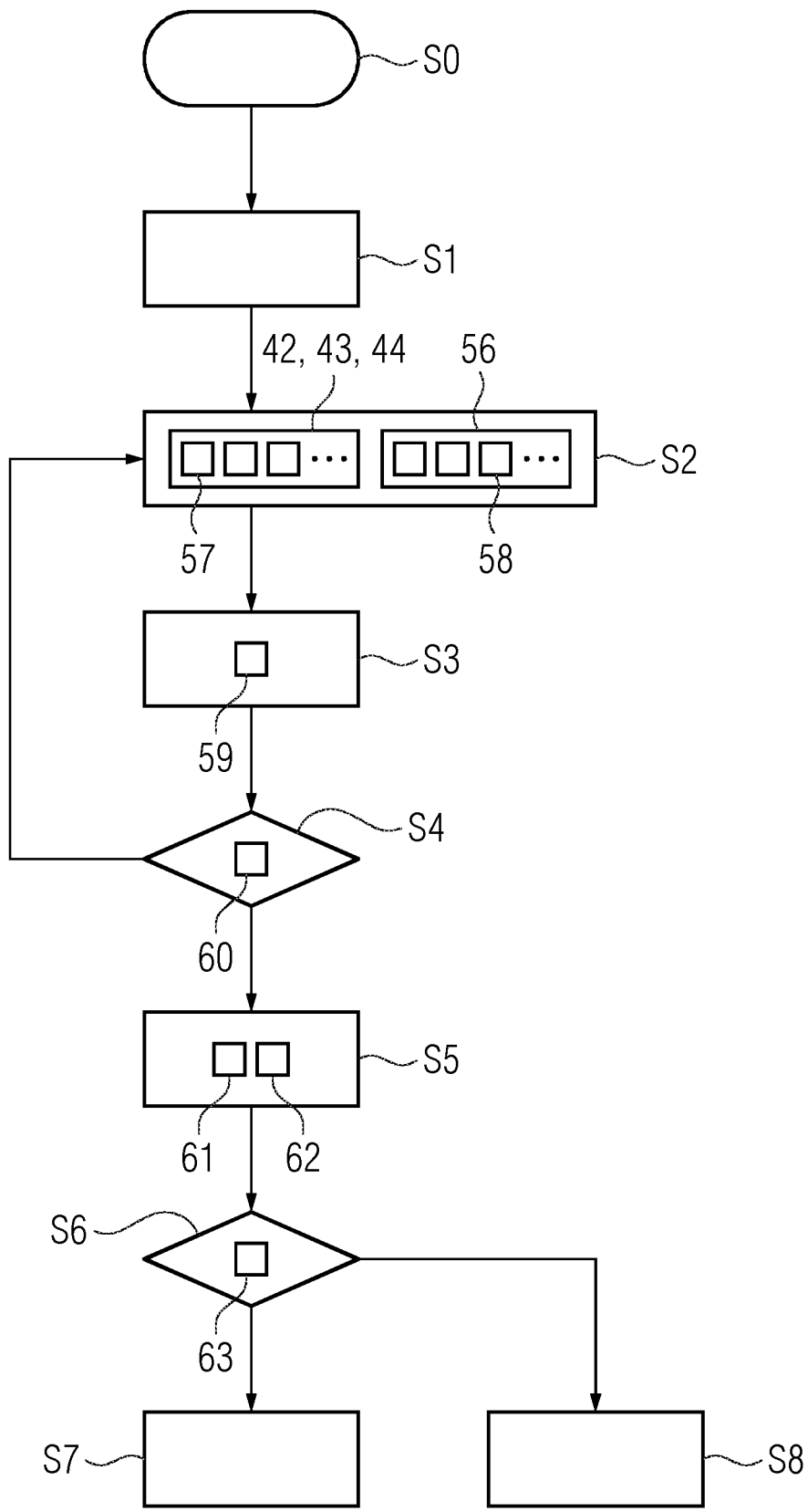
FIG. 9 shows a flow chart of an exemplary embodiment of the method for detecting an electrical fault in the stator of an electric machine.

Based on these observations, the operation of the monitoring device 14 and the method for detecting the electrical fault in the stator 4 will now be discussed in detail with reference to the flow chart of an exemplary embodiment of such a method shown in FIG. 9. In the most general sense the method comprises the determination of a current between a respective subgroup 64, 65, 66 of the respective group 38, 51, 52 of windings 19-27 and a distinct further subgroup 39, 53, 54 of the windings 19-27 of the same group 38, 51, 52 in step S2 and the evaluation of a fault condition 63 in step S6 that depends on these currents. If fault condition 63 is fulfilled, a signal 83 is output to personal and/or a device 15.

In an initial state in step S0, the wind turbine 1 is at a standstill. In step S1 actuators 50 are used to pitch the rotor blades 6. Therefore, the hub 5 and the rotor 3 start to rotate with an increasing rotational speed.

While the rotational speed is slowly increasing, a respective measurement 57 is acquired in step S2 for each of the currents 42, 43, 44 via the respective current sensors 9, 10, 11 by the processing unit 12. At the same time, a measure 58 for the vibration 56 is acquired by the processing unit 12 via the accelerometer 13. It is especially possible to measure vibrations with an accelerometer attached to a stationary part, e.g., a bearing or a stator. As discussed below, step S2 will be repeated multiple times during a time interval during which the rotational speed increases from a standstill to slightly below a cut-in speed at which the electric machine would be connected to a load 55. Therefore, a respective time sequence of measurements 57 for each of the currents 42, 43, 44 and of measures 58 for the vibration 56 is acquired.

As previously discussed, each of the measured currents 42, 43, 44 is a current between a subgroup 64, 65, 66 of the windings 19-27 of a respective group 38, 51, 52 of windings 19-27 and a further subgroup 39, 53, 54 comprising at least one further winding 19-27 of the respective group 38, 51, 52 of windings 19-27. The subgroup 64 only comprises a single winding 19, the subgroup 65 only comprise a single winding 20 and the subgroup 66 only comprises a single winding 21. The further subgroup 39 comprises the windings 22 and 25, the further subgroup 53 comprises the windings 23 and 26 and the further subgroup 54 comprises the further windings 24 and 27.

In step S3 a rotational speed 59 is determined, e.g., by an additional sensor that is not shown. The rotational speed 59 is compared to a threshold 60 in step S4 and step S2 is repeated if the rotational speed 59 is below this threshold 60.

Once the rotational speed 59 exceeds the threshold 60, a respective maximum value 61 is determined for each of the currents 42, 43, 44 based on the maximum of the measurements 57. Additionally, a maximum value 62 is determined for the vibration 56.

In step S6 the fault condition 63 is evaluated. The fault condition 63 can be fulfilled, when at least one of the maximum values 61 for the currents 42, 43, 44 exceeds a given threshold.

Optionally the fault condition can, only be fulfilled when the maximum value 62 for the vibration 56 also exceeds the threshold or when a combined fault value calculated from the maximum values 61, 62, e.g., by multiplying the maximum values, exceeds a threshold.

If the fault condition 63 is not fulfilled, normal operation of the wind turbine 1 can continue in the step S8, e.g., by closing the circuit breaker 34 and therefore providing power to the load 55 once a cut-in speed is exceeded.

If on the other hand the fault condition 63 is fulfilled, the processing unit 12 can output a control signal to an output device 86. In the simplest case the output device 86 can be a device for outputting an optical or an acoustic signal to personal, e.g., a signal lamp, a loudspeaker, etc. It can however be advantageous to instead output a signal 83 to a device 15, e.g., to a central unit of a wind park, a communication device of service personal, in internal control unit of the wind turbine or the generator itself, etc. Typically, it is advantageous to provide the signal to a controller that can prevent and/or stop the further operation of the electric machine locally and/or quickly.

As indicated by the dashed squares 85 in FIG. 2 instead of the current sensors 9-11 that measure a respective current between two subgroups 64-66 and 39, 53, 54 of windings 19-27, a measurement of the respective current between the respective subgroup 64, 65, 66 and a neutral point 35 that is connected to at least one winding 19, 20, 21 of each of the groups 38, 51, 52 could be used. The measured currents are then processed as discussed above to evaluate the fault condition 63.

Figure 10:
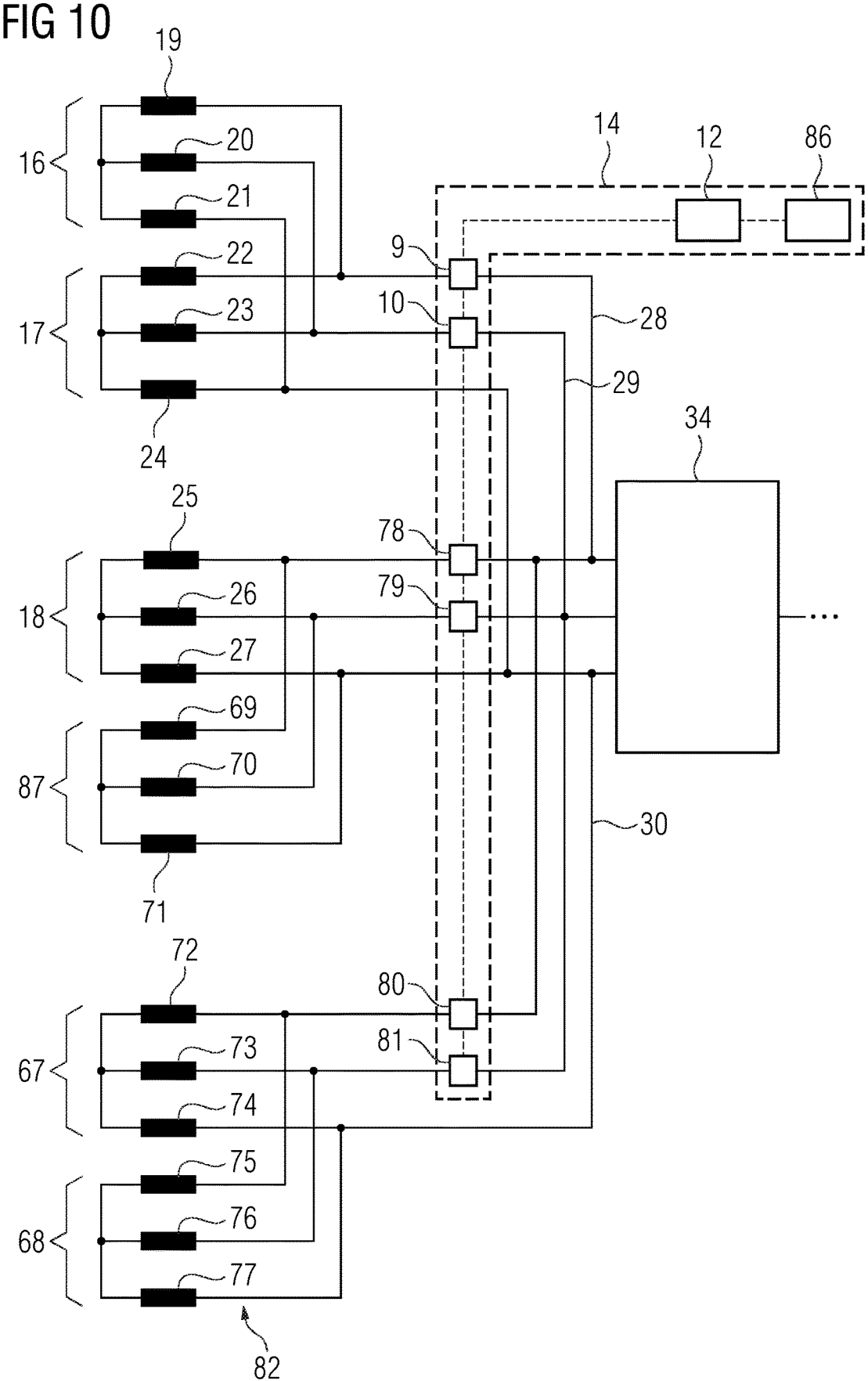
FIG. 10 shows a schematic diagram of a further exemplary embodiment of an electric machine arrangement.

FIG. 10 shows a different example of an electric machine arrangement that could be used instead of the electric machine arrangement shown in FIG. 2. The electric machine arrangement shown in FIG. 10 comprises an electric machine 82, wherein only the windings 19-27, 69-77 of the stator of this electric machine 82 are shown in FIG. 10, and a monitoring device 14 that uses six current sensors 9, 10, 78-81. The windings 19-27, 69-77 are separated into groups that are assigned for the phases 28, 29, 30 and into segments 16, 17, 18, 67, 68, 87, wherein each segment 16, 17, 18, 67, 68, 87 comprises a winding 19-27, 69-77 of each of the groups and therefore of each of the phases 28, 29, 30.

A major difference to the embodiment according to FIG. 2 is the use of a single current measurement and therefore a single current sensor 9, 10, 78, 79, 80, 81 to measure a current between two subgroups, each comprising multiple windings 19-69, 70-77. The current sensor 9 for example measures a current between a first subgroup comprising the windings 19 and 22 to a further subgroup comprising the windings 25, 69, 72 and 75. The current sensor 10 on the other hand measures the current between a first subgroup comprising the windings 20, 23 to a further subgroup comprising the windings 26, 70, 73 and 76. Measuring a high current via the current sensor 9 indicates that there is an electrical fault in the windings 19 or 22. Similarly a high current measured by the current sensor 10 indicates an electrical fault in either the winding 20 or the winding 23.

In the example shown in FIG. 10, there is no current sensor directly measuring any currents in the phase 30. Such current sensors are not necessary, since e.g. the current from the windings 21 and 24 to the further windings 27, 71, 74 and 77 can be directly calculated based on the current measurements by the current sensors 9 and 10. Therefore based on the current measurements of the current sensors 9 and 10, electrical faults in the windings 19-24 of the segments 16 and 17 can be detected and it can be determined, the windings 19-24 of which one of the phases 28, 29, 30 in the segment 16 or 17 are faulty.

In the same way the current sensors 78, 79 can be used to determine an electrical fault in the segments 18, 87 and the current sensors 80, 81 can be used to determine an electrical fault in the segments 67, 68.

The embodiment shown in FIG. 10 allows for a monitoring of a large number of windings 19-27, 69-77 for electrical faults with a pretty good localization of electrical faults within two respective windings. At the same time the technical complexity of the monitoring device 14 is relatively low, since only six current sensors 9, 10, 78-81 are necessary for the three segments shown. The number of necessary sensors would obviously increase with the number of used segments.

Figure 11:
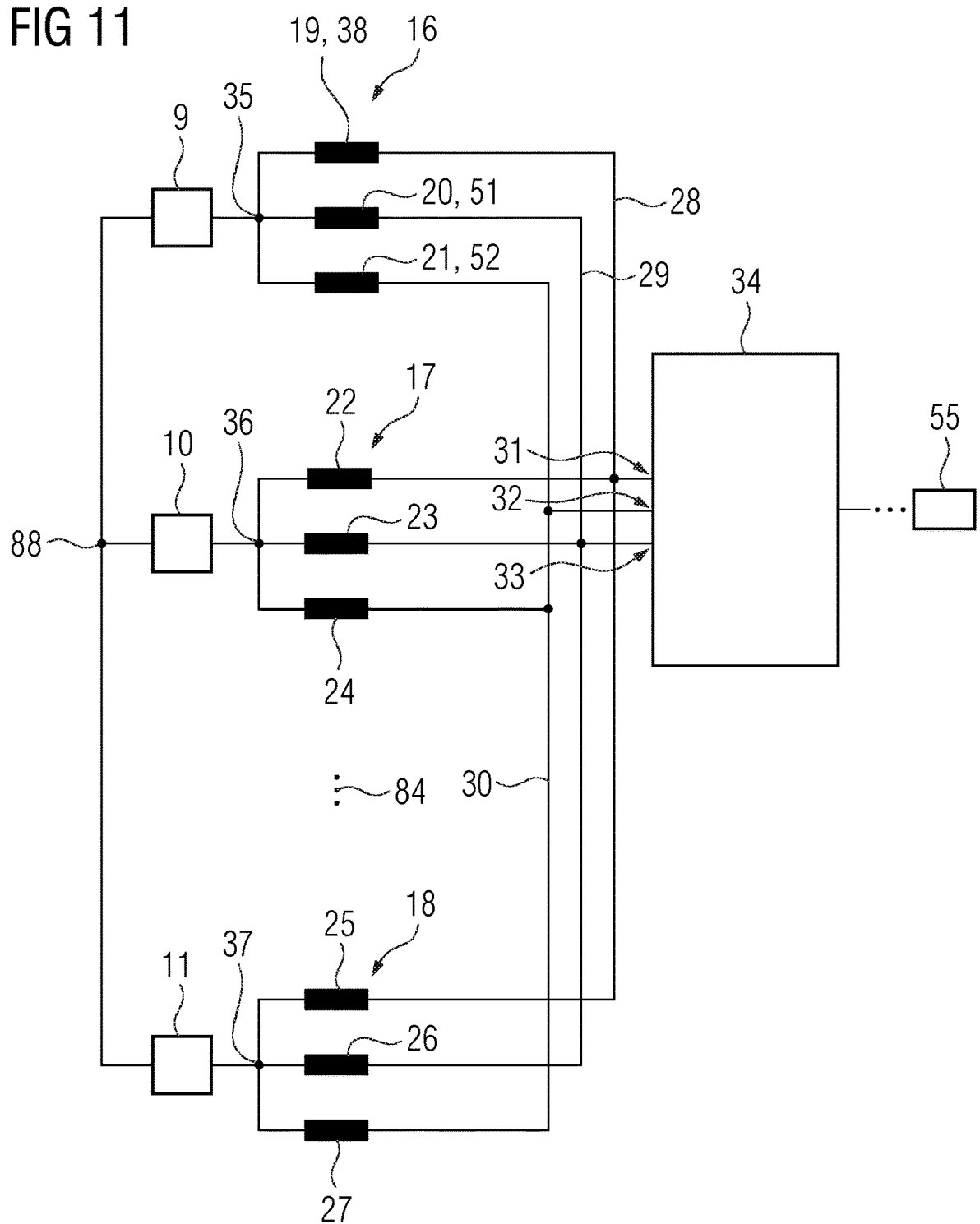
FIG. 11 shows a schematic diagram of a further exemplary embodiment of an electric machine arrangement.

FIG. 11 shows another embodiment of an electric machine arrangement. This embodiment is in many aspects similar to the embodiment shown in FIG. 2, therefore only the distinguishing features will be discussed in detail. For simplicity's sake only the wiring of the windings 20-27 and the positions of the current sensors are shown.

The embodiment uses a common neutral point 88, wherein the neutral points 35-37 of the different segments are connected to the common neutral point 88 via a respective current sensor.

An electrical fault in a winding 19-27 within a segment 16-18 changes the potential at the neutral point 35-37 of that segment 16-18 and therefore causes a current to flow through the respective current sensor 9-11. By measuring the currents between the neutral points 35-37 and the common neutral point 88, it is therefore possible to localize defects in any of the segments 16-18 by using only a single current sensor 9-11 per segment.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The claims are as follows:

1. A method for detecting an electrical fault in the stator of an electric machine, wherein the stator comprises multiple groups of windings, wherein the windings of each group are assigned to a respective phase of the electric machine, comprising:
   determining a current
   between a neutral point that is connected to at least one winding of each of the groups and either a further neutral point that is connected to at least one further winding of each of the groups or to a common neutral point connected to at least the neutral point and the further neutral point,
   evaluating a fault condition, wherein the fulfilment of the fault condition depends on the determined current, and
   outputting a fault signal to personnel and/or a device when the fault condition is fulfilled.

2. The method according to claim 1, wherein a respective further current is determined between a subgroup of one of the groups of windings comprising at least one winding of that group and a distinct further subgroup of the same group of windings comprising at least one further winding of the same group and/or between a subgroup of one of the groups of windings comprising at least one winding of that group and a neutral point that is connected to at least one winding of each of the groups,
   wherein the fulfilment of the fault condition additionally depends on the determined respective further current.

3. The method according to claim 2, wherein respective further currents are determined for at least two of the groups and/or for at least two distinct subgroups of at least one of the groups, wherein the respective subgroup comprises at least one winding and the current for a respective subgroup is the current between the respective subgroup and either a respective further subgroup of the same group of windings comprising at least one further winding of the same group or the neutral point or a respective neutral point, wherein the fulfilment of the fault condition depends on the determined currents.

4. The method according to claim 2, wherein the respective further current is determined using a current sensor connected between the subgroup of the windings and either the phase connection for that group of windings or the neutral point.

5. The method according to claim 1, wherein the current is determined while there is no power provided by the electric machine and/or while the phase connections of the stator are disconnected from a load and/or while the current driven through the phase connections is zero or lower than a threshold.

6. The method according to claim 1, wherein multiple measurements of the current are taken over a given time interval, wherein the fulfilment of the fault condition depends on the multiple measurements.

7. The method according to claim 6, wherein the rotational speed of the rotor of the electric machine is increased during the given time interval.

8. The method according to claim 6, wherein the electric machine is a generator of a wind turbine, wherein the wind turbine is started by pitching blades of the wind turbine to increase the speed of the rotor of the electric machine from a standstill, wherein the given time interval covers at least part of the time interval between a starting time at which the rotor is at a standstill and an ending time at which the electric machine is connected to a load.

9. The method according to claim 6, wherein a respective maximum value for the current is determined from the multiple measurements for the current, wherein the fulfilment of the fault condition depends on the respective maximum value.

10. The method according to claim 1, wherein several segments of the stator each comprise at least one winding of each group, wherein the windings of the respective segment are connected to a neutral point of that segment,
- wherein either the windings of at least one of the segments provide the only electrical connection between the neutral point of that segment and the windings of the other segments,
- or wherein the neutral points are connected to a common neutral point, especially via a respective current sensor.

11. The method according to claim 1, wherein a respective measure for vibrations of the electric machine and/or for an amplitude of torque oscillations of the torque acting on the rotor of the electric machine is determined, wherein the fulfillment of the fault condition depends on the respective measure.

12. An electric machine arrangement, especially for a wind turbine, comprising an electric machine with a stator having multiple groups of windings, wherein the windings of each group are assigned to a respective phase of the electric machine, and a monitoring device, wherein the monitoring device and the electric machine are configured to perform the method according to claim 1.

13. A wind turbine, wherein it comprises an electric machine arrangement according to claim 12.

* * * * *